(12) United States Patent
Hlad et al.

(10) Patent No.: US 8,835,217 B2
(45) Date of Patent: Sep. 16, 2014

(54) DEVICE PACKAGING WITH SUBSTRATES HAVING EMBEDDED LINES AND METAL DEFINED PADS

(75) Inventors: Mark S Hlad, Chandler, AZ (US); Islam A Salama, Chandler, AZ (US); Mihir K Roy, Chandler, AZ (US); Tao Wu, Chandler, AZ (US); Yueli Liu, Gilbert, AZ (US); Kyu Oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 577 days.

(21) Appl. No.: 12/975,934

(22) Filed: Dec. 22, 2010

(65) Prior Publication Data

US 2012/0161330 A1    Jun. 28, 2012

(51) Int. Cl.
*H01L 21/44* (2006.01)
*H01L 23/02* (2006.01)

(52) U.S. Cl.
USPC ........... 438/106; 438/107; 438/108; 438/612; 257/678

(58) Field of Classification Search
USPC ................................ 438/106–108, 612–615
See application file for complete search history.

(56) References Cited

U.S. PATENT DOCUMENTS

| | | | |
|---|---|---|---|
| 7,049,697 B2 * | 5/2006 | Pogge et al. | 257/723 |
| 7,060,526 B2 * | 6/2006 | Farnworth et al. | 438/106 |
| 7,348,677 B2 | 3/2008 | Larnerd et al. | |
| 7,776,734 B2 | 8/2010 | Nalla | |
| 2004/0084206 A1 * | 5/2004 | Tung | 174/255 |
| 2006/0094228 A1 | 5/2006 | Lei et al. | |
| 2008/0115968 A1 | 5/2008 | Suh et al. | |
| 2008/0194095 A1 | 8/2008 | Daubenspeck et al. | |
| 2009/0289360 A1 * | 11/2009 | Takahashi et al. | 257/737 |
| 2009/0325379 A1 | 12/2009 | Hlad | |
| 2010/0052135 A1 * | 3/2010 | Shim et al. | 257/686 |
| 2010/0078826 A1 | 4/2010 | Gurumurthy | |
| 2010/0164098 A1 * | 7/2010 | Kuechenmeister et al. | 257/737 |
| 2010/0276185 A1 | 11/2010 | Nalla | |

OTHER PUBLICATIONS

International Search Report and Written Opinion for International Application No. PCT/US2011/063409 dated Aug. 9, 2012, 10 pages.

* cited by examiner

*Primary Examiner* — Hsien Ming Lee
(74) *Attorney, Agent, or Firm* — Blakely, Sokoloff, Taylor & Zafman LLP

(57) ABSTRACT

Package substrates enabling reduced bump pitches and package assemblies thereof. Surface-level metal features are embedded in a surface-level dielectric layer with surface finish protruding from a top surface of the surface-level dielectric for assembly, without solder resist, to an IC chip having soldered connection points. Package substrates are fabricated to enable multiple levels of trace routing with each trace routing level capable of reduced minimum trace width and spacing.

5 Claims, 10 Drawing Sheets

DEVICE PACKAGING WITH SUBSTRATES HAVING EMBEDDED LINES AND METAL DEFINED PADS

FIELD

Embodiments of the present invention relate to the semiconductor devices and more particularly to semiconductor device packaging.

DISCUSSION OF RELATED ART

Integrated circuit (IC) devices, such as microprocessors are often packaged with a chip mounted to a package substrate using a microball bump technology. Advances in the art continue to place a demand for device packaging capable of increased chip input/output (I/O) with reduced bump pitches. A conventional package substrate for microball technology is typically fabricated with a semi-additive process (SAP), as illustrated in FIG. 1.

As shown in FIG. 1, the SAP 100 first forms a dielectric build up layer 104 over a metallized pad 102 formed in one of the layers of substrate 101. A via hole 109 is then laser drilled in the dielectric build up layer 104 and a metallic seed layer 115 is formed over the substrate. A temporary resist pattern 120 is lithographically patterned over the metallic seed layer 115 and the conducting traces and vias 125 are electroplated on the metallic seed layer 115. The temporary resist pattern 120 is then removed and the metallic seed layer 115 etched away. The SAP 100 continues in this manner to build up any number of metallization layers on a package substrate until a first (i.e. top) level metal is formed to which a solder ball is to be attached. Assuming the conducting traces and vias 125 are the surface level metal, a solder resist film 140 is then formed over the conducting traces and vias 125. A solder resist film 140 is then lithographically patterned to form an opening over the metallized pad 136, and a surface finish 145 is applied to the exposed portion of the metallized pad 136. A microball technology is then used to place a solder ball 150 into the solder resist mask opening which is then reflowed.

At assembly, a chip connection point, such as a copper post formed as part of a chip-side C4 process, is then aligned to the reflowed solder ball 150, and another solder reflow is performed to join the chip to the substrate. An underfill and/or encapsulation process then completes the conventional process using microball technology.

As the bump pitch shrinks based on the demand for higher I/O routing, the package substrate line and spacing reduces accordingly, placing significant challenges on the current SAP to achieve high yields. Reduced bump pitches also place a demand on the current microball technology to achieve high backend yields (minimal losses due to bump bridging and missing solder ball). To achieve these high yields at reduced bump pitch, the solder ball diameter should be lower leading to a lower bump height, which is a challenge for the assembly deflux process.

DETAILED DESCRIPTION

Figure 1:
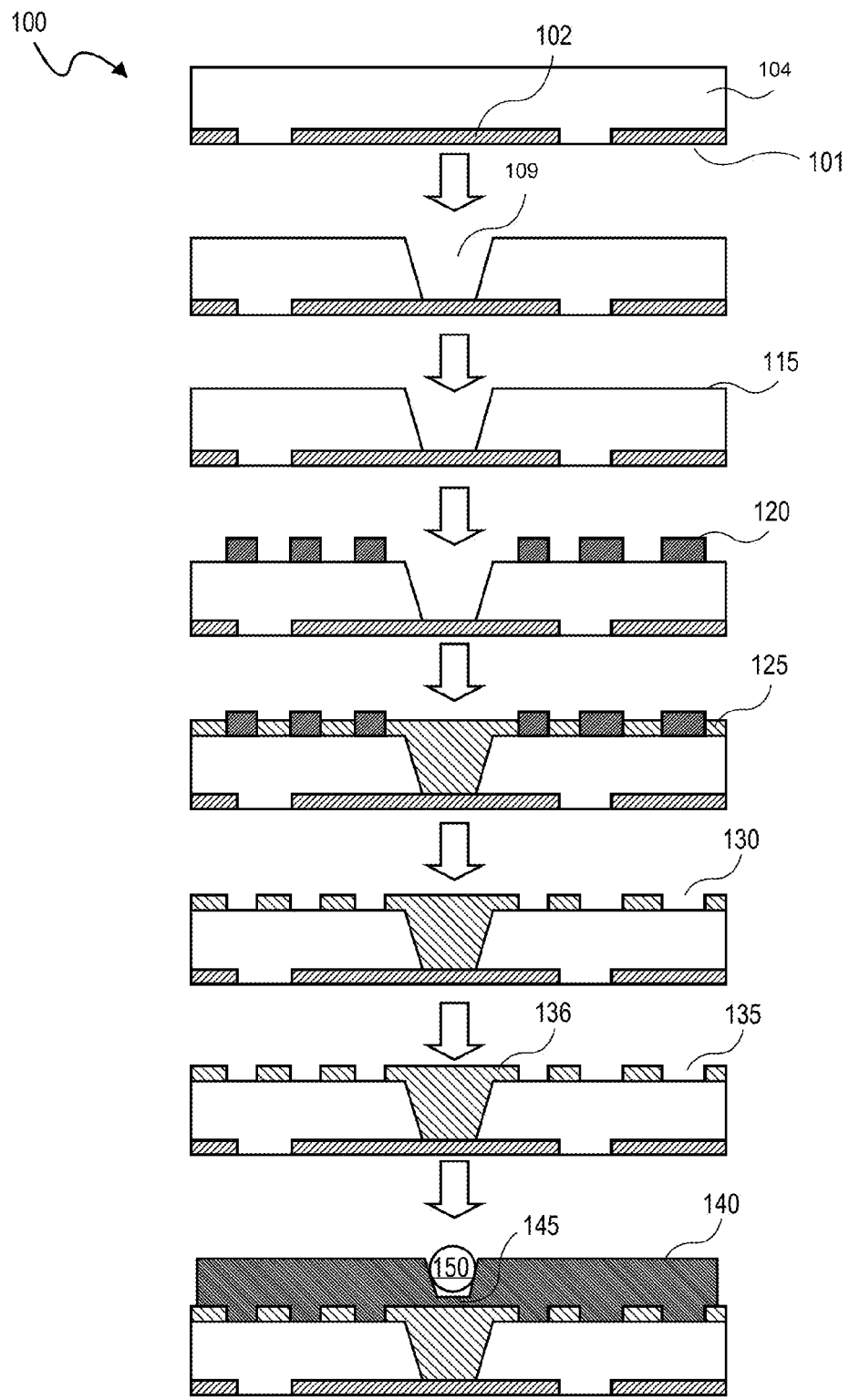
FIG. 1 is a cross-sectional view of a conventional semi-additive substrate fabrication process.

In the following description, numerous specific details are set forth to provide a thorough understanding of the present invention. It will be apparent to one skilled in the art that the present invention may be practiced without these specific details. In other instances, well-known features, such as specific fabrication techniques, are not described in detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Described herein are methods of fabricating integrated circuit (IC) chip package substrates which enable IC chip-substrate assemblies to be formed in a package with a reduced bump pitch. In certain embodiments, a package substrate is fabricated to facilitate assembly which places a solder ball on the chip side and involves direct contact of the solder to a metal defined pad on the substrate rather than pad defined by a solder resist. As such, in certain such embodiments, no solder resist is present on the surface of the package substrate and no solder is placed on the package substrate prior to coupling a chip to the package substrate. The fabrication processes described herein for an embedded surface metal feature may be repeated multiple times to provide routing on multiple layers. BHAST reliability issues that might exist where surface-level metal features are exposed to underfill (e.g., instead of solder resist) are mitigated by embedding the metal features in a surface-level dielectric film.

Figure 2A:
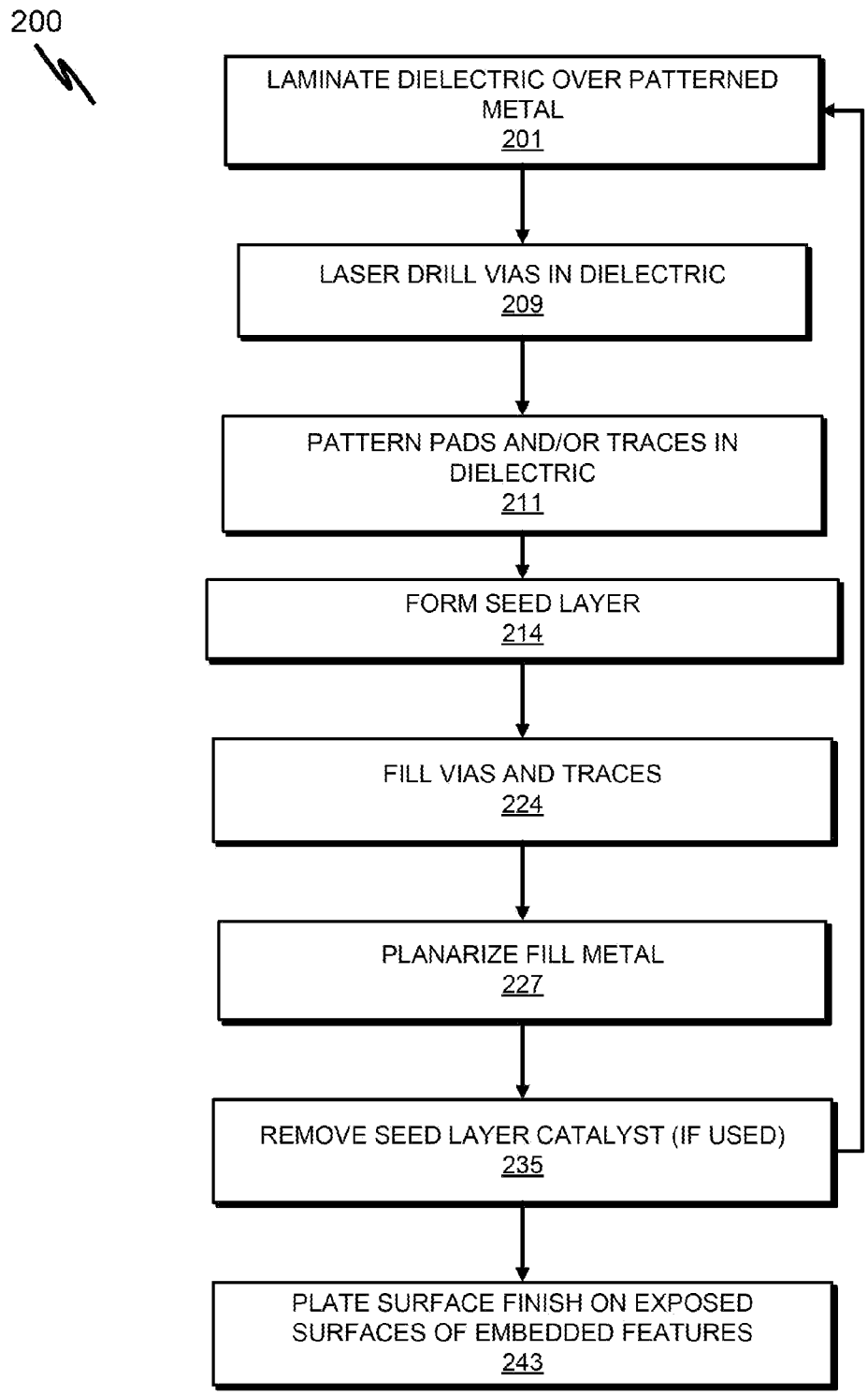
FIG. 2A is a flow diagram of a package substrate fabrication process for reduced bump pitch in accordance with an embodiment of the present invention.
Figure 2B:
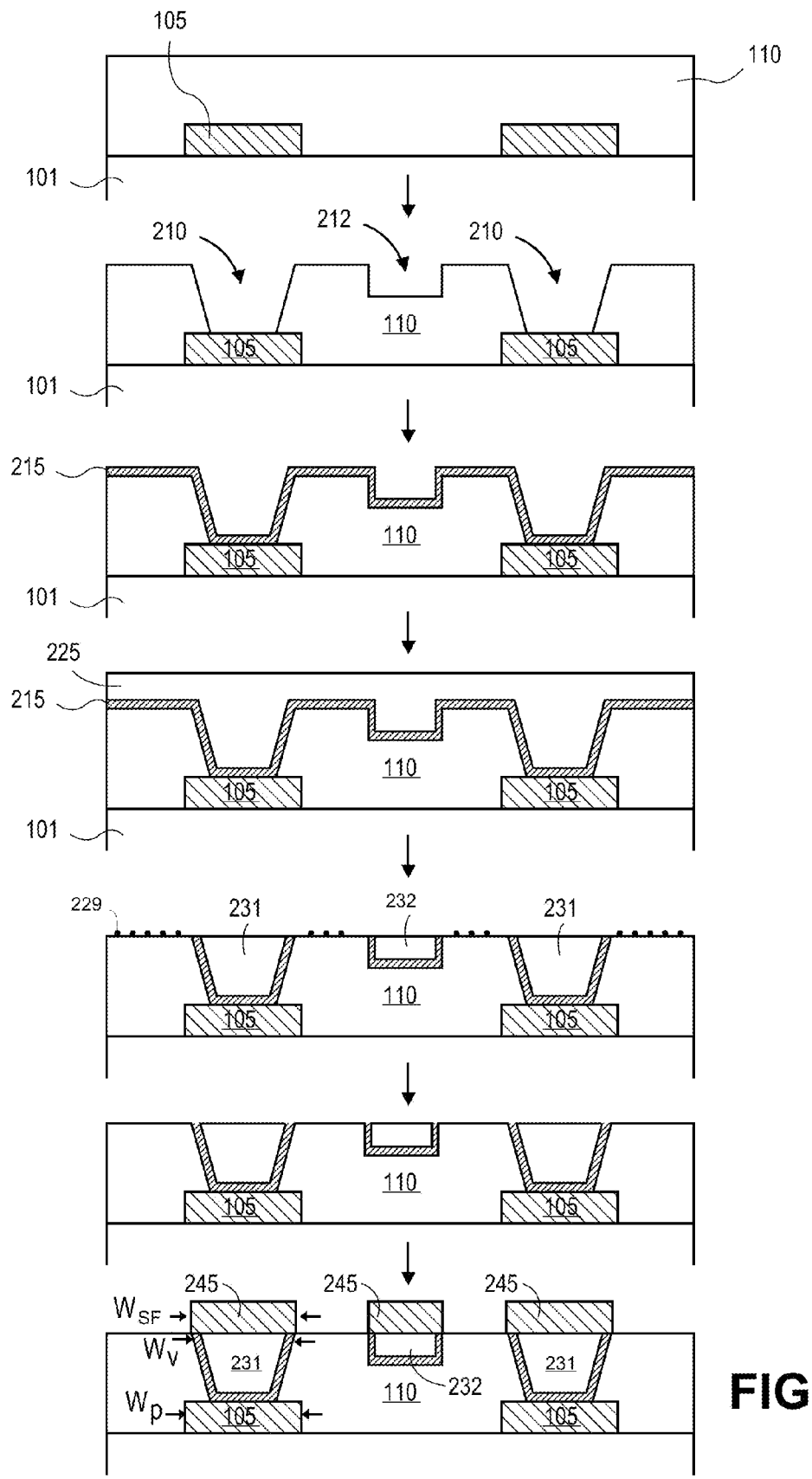
FIG. 2B is a cross-sectional view of selected operations illustrating stages in the package substrate fabrication process described in FIG. 2A, in accordance with an embodiment of the present invention.

FIG. 2A is a flow diagram of a package substrate fabrication process 200 for reduced bump pitch in accordance with an embodiment of the present invention. FIG. 2B provides cross-sectional views of selected operations illustrating stages in the package substrate fabrication process 200, in accordance with an exemplary embodiment.

Process 200 begins at operation 201 with lamination of a dielectric layer (e.g., surface dielectric layer 110 in FIG. 2B) over a patterned metal layer (e.g., sub-surface-level metal feature 105) in a substrate build-up layer 101. Generally, the patterned metal layer and any number of layers below the patterned metal layer may be formed in any manner known in the art. For example, the patterned metal layer may be a top build-up layer formed with an SAP similar to that illustrated in FIG. 1. The dielectric layer may be of any composition known in the art and applied over the patterned sub-surface level metal layer in any conventional manner. In a particular embodiment, the dielectric layer 110 comprises a polymer (epoxy based resin) with silica filler to provide suitable mechanical properties that meet reliability requirements of the package. The material must also have a suitable ablation rate to enable laser patterning as described elsewhere herein.

Returning to FIG. 2A, at operation 209 via holes (e.g., via holes 210 in FIG. 2B) are laser drilled into the dielectric layer (e.g., surface dielectric layer 110) to expose a portion of the underlying metal layer. Any conventional technique may be used, such as one employing $CO_2$ laser. At operation 211 the dielectric is then further laser patterned to form a trace recess (e.g., trace recess 212 in FIG. 2B) and/or a pad recess (not depicted) with a depth in the dielectric that is less than that of the vias (i.e., the sub-surface level metal feature 105 is not exposed by the patterning at operation 211). As shown in FIG. 2B, the trace recess 212 is laterally space apart from the underlying sub-surface-level metal feature 105. Although not depicted in FIG. 2B, it should be appreciated that a pad recess disposed over the via 231 (e.g., similar to that depicted in FIG. 4B) may also be formed by the process which forms the trace recess 212. To form the trace recess 212 and/or a pad recess, laser patterning may be performed, for example with an excimer laser.

Next, at operation 214, a seed layer (e.g., seed layer 215 in FIG. 2B) is deposited. In one embodiment, electroless plating is used to form the seed layer 215. For example, a catalyst, such as palladium (Pd) may be deposited followed by an electroless copper plating process. In an alternate embodiment, a physical vapor deposition (i.e., sputtering) technique is used to deposit the seed layer 215.

The via holes, trace recesses, and/or pad recesses are then filled at operation 224, for example with an electrolytic plating process. As shown in FIG. 2B, an electrolytic copper plating process is performed to deposit the fill metal 225. At operation 226, over plated fill metal is then removed by one or more of, etching, buff grinding, chemical-mechanical polishing, etc. to planarize the fill metal 225. For example, chemical, mechanical polishing (CMP) or buff grinding may be used to first planarize the fill metal 225 and then an etch may be employed to remove any remaining fill metal 225 from the top surface of the surface-level dielectric layer 110, thereby delineating an embedded metallized via 231 and an embedded metallized trace 232. The embedded metallized trace 232 may be a necking trace that is carrying a signal from a connection that has been made between the die and substrate elsewhere and therefore may not be bonded directly to the solder on the die side. As further illustrated, sub-surface-level metal feature 105 has sidewalls adjacent to the surface-level dielectric layer 110 in which the metallized via 231 and metallized trace 232 are embedded.

For embodiments where the seed layer was electrolessly plated, any catalyst remaining after operation 227 may be removed at operation 235 to eliminate the risk of surface finish metals subsequently plating on the surface-level dielectric layer 110. Various chemical solutions are commercially available to remove a catalyst depending on the fill metal and the catalyst employed. For example, as shown in FIG. 2B, a Pd catalyst 229 may be removed with a commercially available wet chemical treatment without etching a copper fill metal 225. For embodiments where the seed layer was sputtered, operation 235 may be skipped.

At operation 243, a surface finish metal is formed on all of the exposed surfaces of the embedded metal features (e.g., top surfaces of embedded metallized via 231 and embedded metallized trace 232), forming a protrusion beyond a top surface of the surface-level dielectric layer 110. While the surface finish metal is of a different composition than the fill metal 225, a variety of surface finish metal compositions or plated stacks may be employed. In the exemplary embodiment depicted in FIG. 2B, an electroless plating process is used to form the surface finish metal 245 comprising at least a layer of nickel (Ni), and may further include additional layers, such as palladium (Pd), and/or gold (Au). In an exemplary embodiment, the surface finish metal 245 includes a 6-8 μm thick nickel layer.

In one embodiment, a catalyst, such as Pd, is formed only on the exposed copper fill metal 225 (e.g., Pd catalyst will only remain on exposed Cu metal due to differences in pre-treatments and Pd activation steps in the surface finish process compared to that in seed layer deposition process). With no catalyst present on the surface-level dielectric layer 110, the surface finish metal may be plated in a self-aligned manner so that no masking of the fill metal 225 is necessary and therefore no additional overlay/dimensional error margin is required. With the surface finish metal 245 only formed on the via, the "top pad" is referred to herein as "metal defined" rather than photo defined or solder resist defined. The critical dimension (CD), or minimum lateral width, $W_{SF}$, of a surface finish metal at a connection point will then be at least as large as the largest diameter, $W_v$, of the underlying embedded metallized via 231 or embedded metallized trace 232, but only larger than $W_v$ to the extent the surface finish metal 245 undergoes lateral expansion during the plating process. Because the metal traces 232 are embedded below the top surface of the surface-level dielectric layer 110, the surface finish metal 245 does not plate on the sidewalls of the fill metal, allowing a reduction in the space between adjacent embedded metallized traces 232. In one embodiment where $W_v$ is approximately 60-65 μm, $W_{SF}$ will be anywhere from equal to $W_v$ (for anisotropic plating) to less than $W_v$ plus twice the thickness of the surface finish metal 245 (for isotropic plating). In particular embodiments where connection points have a pitch (i.e., bump pitch) of approximately 90 μm and pad size of 63 μm, embedded metal traces 232 have a minimum pitch of approximately 9 μm (9 μm smallest laterally dimensioned trace with a 9 μm minimum lateral space to a nearest adjacent metal feature) to provide higher I/O routing density than is possible with SAP.

As further shown in FIG. 2A, the process 200 may repeat operations 201, 209, 211, 214, 224, 227, and 235 to embed metal features in a plurality of levels and enable multiple I/O routing layers, for example with both micro-strip and stripline routing. With multiple layers of embedded metallized traces 232, much higher I/O density is possible where I/O routing is only possible for a surface-level metal layer. After performing the desired number of iterations, the process 200 completes with the self-aligned surface finish plating operation 243.

Figure 3A:
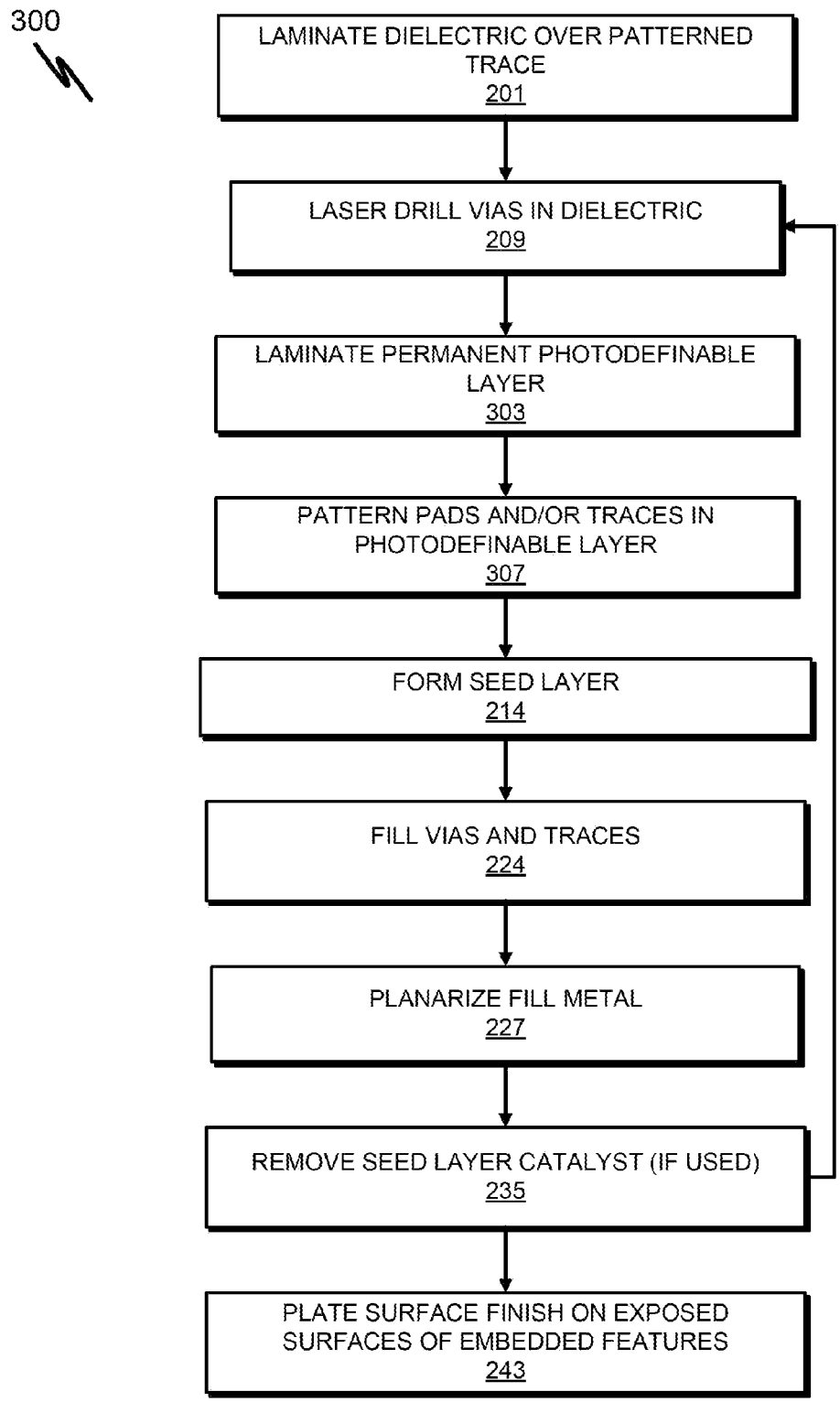
FIG. 3A is a flow diagram of a package substrate fabrication process for reduced bump pitch in accordance with an embodiment of the present invention.
Figure 3B:
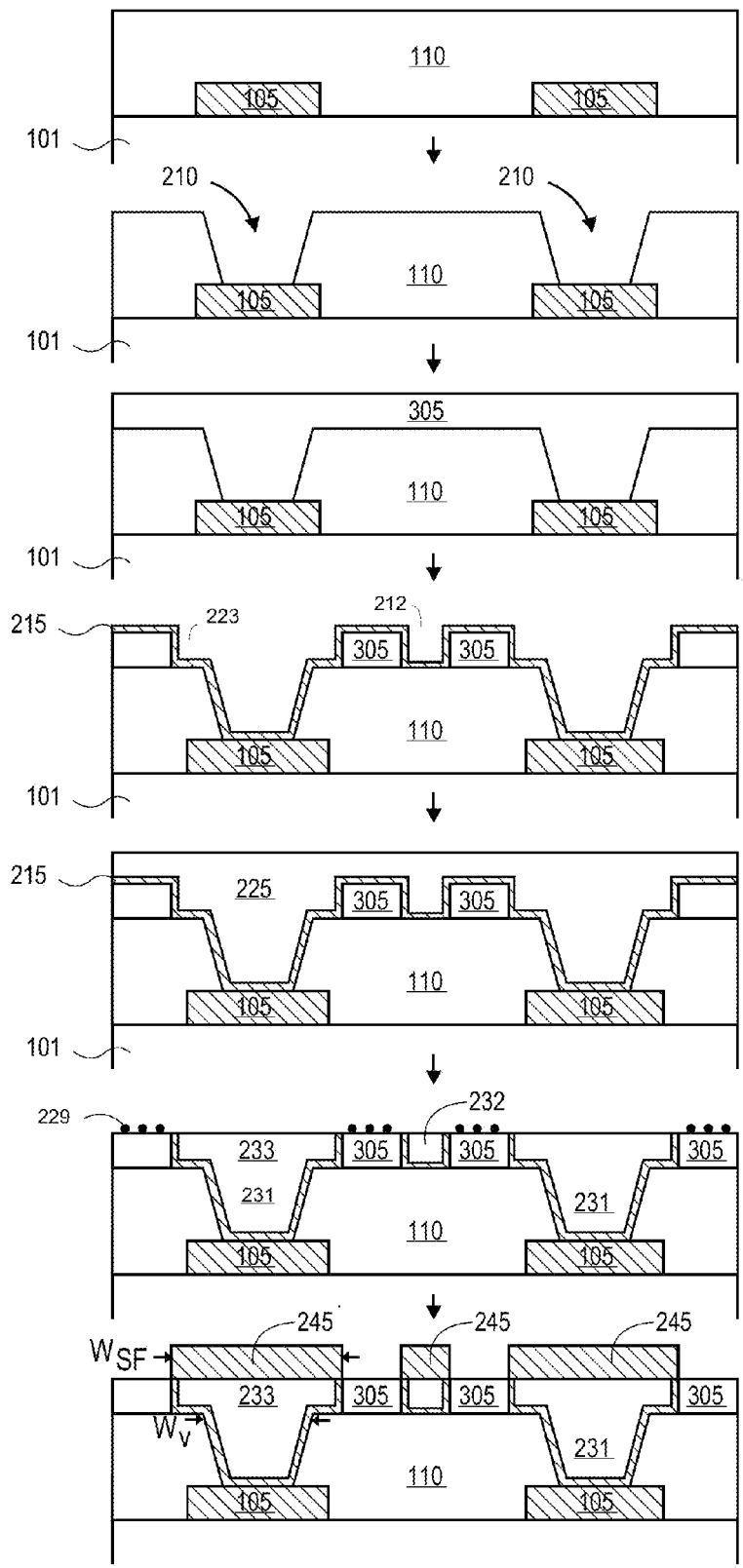
FIG. 3B is a cross-sectional view of selected operations illustrating stages in the package substrate fabrication process described in FIG. 3A, in accordance with an embodiment of the present invention.

FIG. 3A is a flow diagram of a package substrate fabrication process 300 for a reduced bump pitch in accordance with an embodiment of the present invention. FIG. 3B provides cross-sectional views of selected operations illustrating stages in the package substrate fabrication process 300, in accordance with an exemplary embodiment.

As shown in FIG. 3A, at operation 201 a dielectric layer (e.g., the surface-level dielectric layer 110 in FIG. 3B) is laminated over a patterned metal layer (e.g., sub-surface-level metal feature 105) in substantially the same manner described in FIG. 2A. At operation 209, via holes (e.g., via holes 210 in FIG. 3B) are laser drilled into the dielectric layer (e.g., surface-level dielectric layer 110) to expose a portion of the underlying metal layer (e.g., sub-surface-level metal feature 105).

At operation 303, a permanent photodefinable layer (e.g., 305 in FIG. 3B) is laminated or coated. Any material suitable for applications such as controlled collapse chip connect (C4) applications may be utilized as the permanent photodefinable layer 305. For example, the permanent photodefinable layer 305 may be a photodefinable polyimide. At operation 307, the permanent photodefinable layer is exposed and patterned using any conventional lithographic technique to form patterned recesses, such as the trace recess 212 and pad recess 223, as illustrated in FIG. 3B. In the exemplary embodiment, the trace recess 212 has CD of about 5 μm while the pad recess 223 has a CD of about 75 μm with the embedded metallized via 231 having a maximum diameter, $W_v$, of about 50-55 μm.

Operations 214, 224, 227 and 235 are then performed in the same manner described elsewhere herein for the process 200, but with planarization and/or etchback of the fill metal 225 at operation 227 exposing a top surface of the permanent photodefinable layer 305 and delineating an embedded metallized via 231, an embedded metallized top pad 233, and an embedded metallized trace 232. As illustrated, unlike for SAP techniques, sub-surface-level metal feature 105 has sidewalls adjacent to the surface-level dielectric layer 110 in which the metallized via 231 is embedded. Also, because at least some of the permanent photodefinable layer 305 is permanently retained in the package substrate (some of the photo-definable layer may be removed if a CMP planarization method w/out selective etchback was employed) any catalyst (e.g., Pd) utilized to form the seed layer 215 on the sidewalls of the top pad 233 will remain at the interface between the top pad 233 and surface-level dielectric layer 110. Catalyst 229 on the top surface of the permanent photodefinable layer 305 may or may not require removal by a wet chemical treatment prior to surface finish plated depending on the process employed to expose the top surface of the permanent photodefinable layer 305. For example, use of CMP to expose the top surface of the permanent photodefinable layer 305 may also adequately remove any catalyst from the top surface.

As further shown in FIG. 3A, the process 300 may repeat operations 201, 209, 303, 307, 214, 224, 227, and 235 to embed metal features in a plurality of levels and enable multiple routing layers, for example with both micro-strip and stripline routing. With multiple layers of embedded metallized traces 232, much higher I/O density is possible where I/O routing is only possible in a surface-level metal layer. After performing the desired number of iterations, the process 300 completes with the self-aligned surface finish metal plating operation 243.

Following the removal of any catalyst used to form the seed layer 215 from the top surface of the permanent photodefinable layer 305, the surface finish metal 245 is plated at operation 243. In an embodiment, the plating is self-aligned as limited by the exposed area of copper (at the embedded metallized top pad 233, embedded metallized via 231, or embedded metallized trace 232). Because sidewalls of the embedded metallized trace 232 are not exposed, plating of the surface finish metal 245 is more anisotropic allowing minimum spaces between adjacent embedded metallized traces 232 and embedded metalized top pads 233 adjacent to metalized traces 232 to be, for example approximately 5 μm for a 1:1 line:space pitch (in the case of a 90 μm bump pitch with 75 μm pads) even when the surface finish metal thickness is greater than at least half minimum space between adjacent embedded metal filled features (e.g., greater than half the minimum space between adjacent embedded metallized traces 232). The permanent photodefinable dielectric 305 enables formation of a top pad 233 disposed above the metallized via 231. In one exemplary embodiment, the top pad 233 has a maximum lateral dimension greater than a maximum diameter of the via, $W_v$.

Figure 4A:
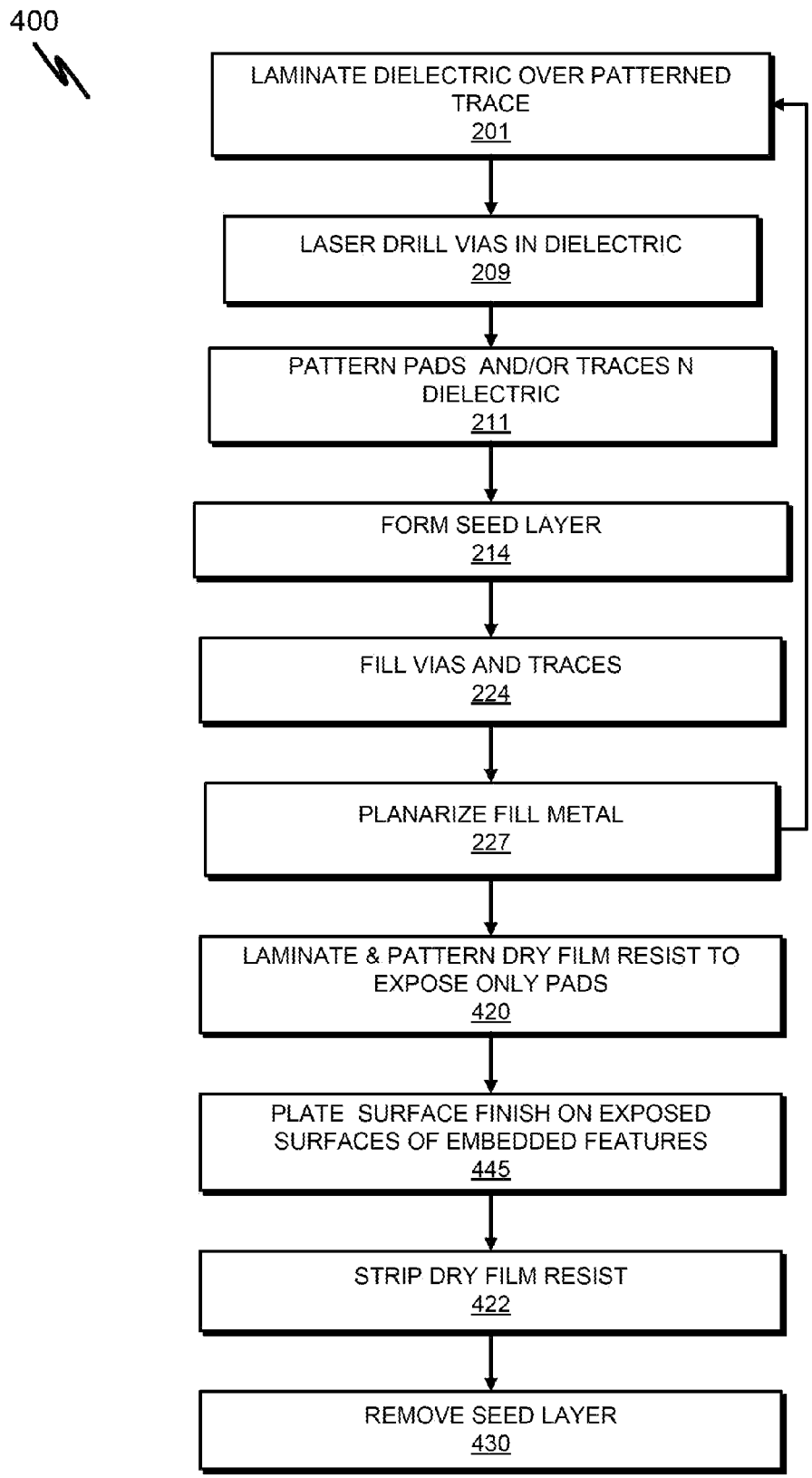
FIG. 4A is a flow diagram of a package substrate fabrication process for reduced bump pitch in accordance with an embodiment of the present invention.
Figure 4B:
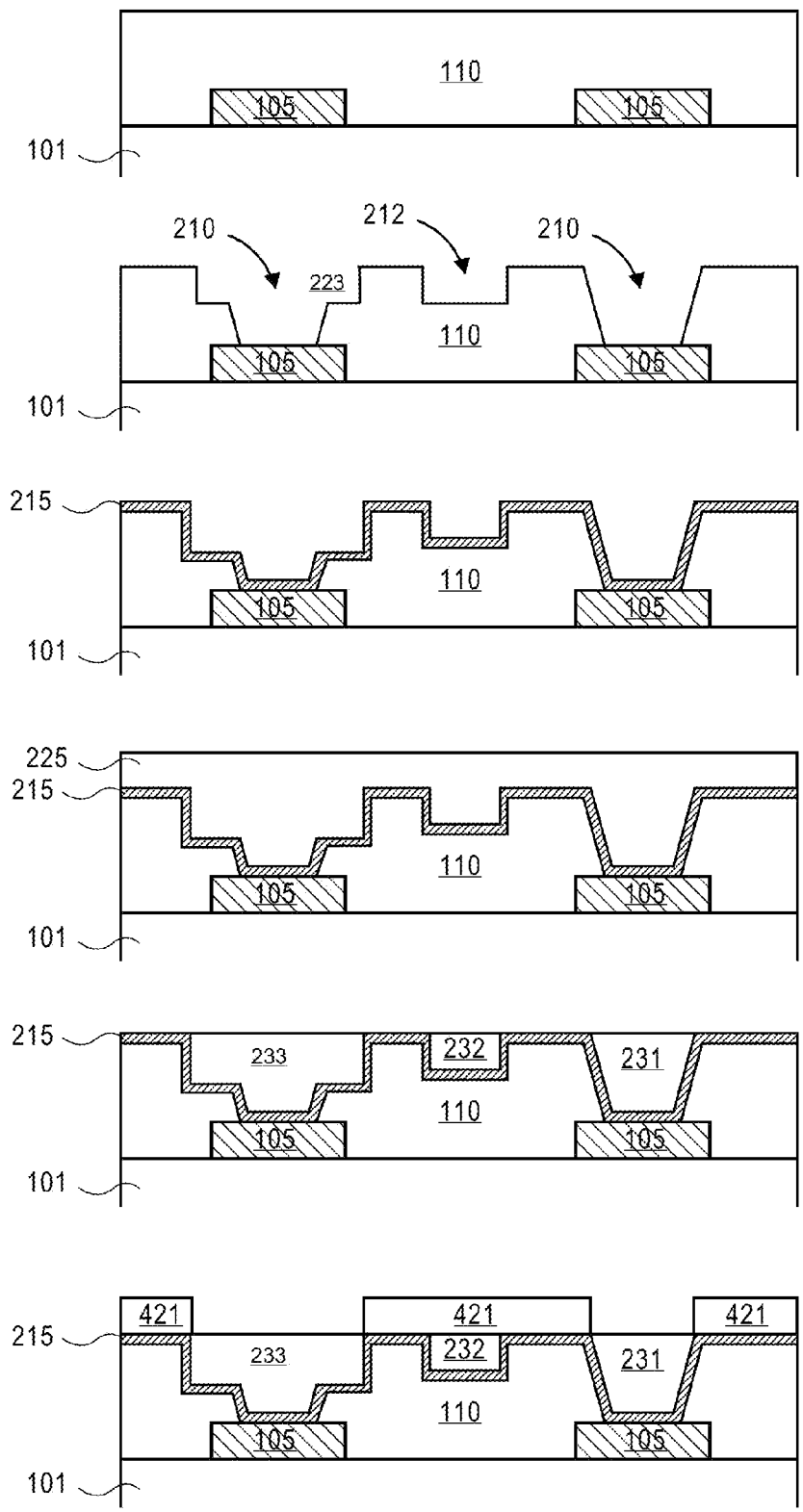
FIG. 4B is a cross-sectional view of selected operations illustrating stages in the package substrate fabrication process described in FIG. 4A, in accordance with an embodiment of the present invention.
Figure 4B:
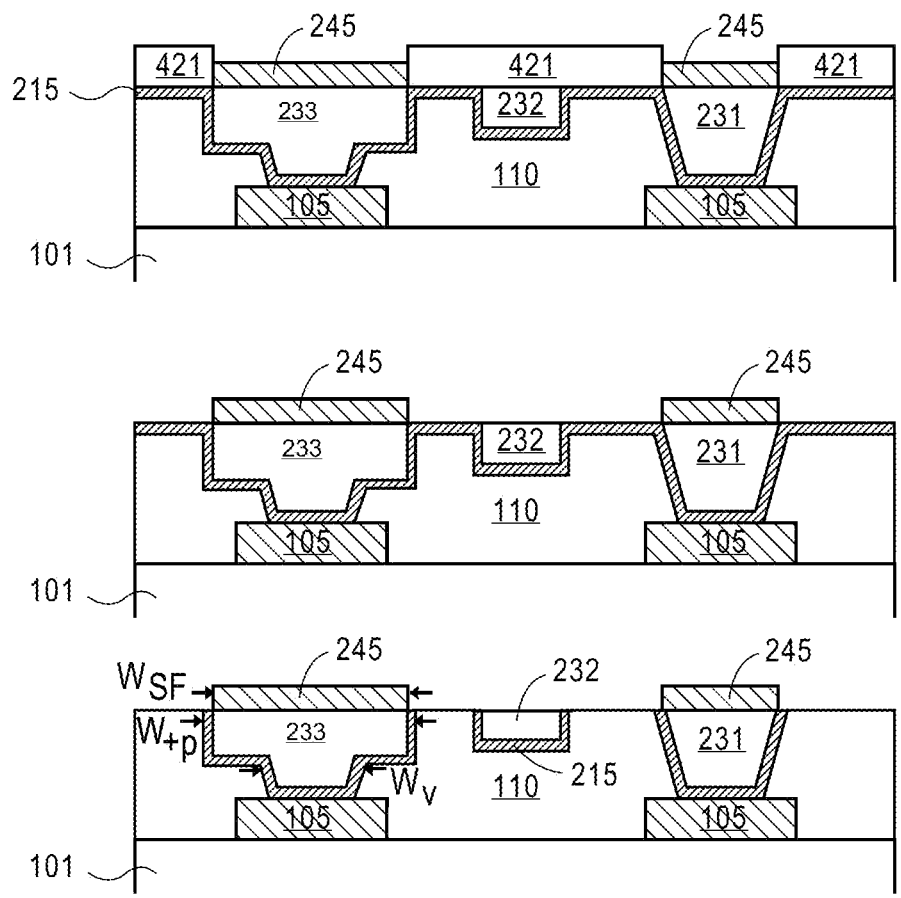

FIG. 4A is a flow diagram of a package substrate fabrication process 400 for a reduced bump pitch in accordance with an embodiment of the present invention. FIG. 4B provides cross-sectional views of selected operations illustrating stages in the package substrate fabrication process 400, in accordance with one exemplary embodiment.

Process 400 begins at operation 201 with lamination of a dielectric layer (e.g., surface-level dielectric layer 110 in FIG. 4B) over a patterned metal layer (e.g., sub-surface-level metal feature 105) in a substrate build-up layer 101. As described elsewhere herein, the patterned metal layer and any number of layers below the patterned metal layer may be formed in any manner known in the art (e.g., with an SAP technique). The dielectric layer may be of any composition known in the art and applied over the patterned sub-surface level metal layer in any conventional manner. In a particular embodiment, the dielectric layer 110 comprises a polymer (epoxy based resin) with silica filler to provide suitable mechanical properties that meet reliability requirements of the package. The material is also to have a suitable ablation rate to enable laser patterning as described elsewhere herein.

Returning to FIG. 4A, at operation 209 via holes (e.g., via holes 210 in FIG. 4B) are laser drilled into the dielectric layer (e.g., surface-level dielectric layer 110) to expose a portion of the underlying metal layer. Any conventional technique may be used, such as one employing $CO_2$ laser. At operation 211 the dielectric is then further patterned to form recesses. FIG. 4B illustrates a trace recess 212 and pad recess 233, each with a depth into the surface-level dielectric that is less than that of the vias (i.e., the sub-surface-level metal feature 105 is not exposed by the patterning at operation 211). For the sake of succinct illustration, both a wide via embodiment and a metallized top pad embodiment is represented in FIG. 4B, but it is to be appreciated that wide via and metallized pad embodiments need not be mixed within a single package substrate and rather one or the other is typically employed in a given substrate. As in process 200, the patterned recesses may be formed by laser patterning.

Next, at operation 214, a seed layer (e.g., seed layer 215 in FIG. 24) is deposited. As in process 200, electroless plating techniques may be used to form the seed layer 215. For example, a catalyst, such as Pd, may be deposited followed by an electroless copper plating process. In an alternate embodiment, a physical vapor deposition (i.e., sputtering) technique is used to deposit the seed layer 215.

The via recesses, top pad recesses, and trace recesses are then filled at operation 224, for example with an electrolytic plating process. As shown in FIG. 4B, an electrolytic copper plating process is performed to deposit the fill metal 225. At operation 226, overplated fill metal is then removed by one or more of, etching, buff grinding, chemical-mechanical polishing, etc. to planarize the fill metal 225. For example, CMP may be used to first planarize the fill metal 225 and then an etch may be employed to leave only a thin metal seed layer 215 on the top surface of the surface-level dielectric layer 110 for subsequent electrolytic plating of a surface finish metal. As illustrated, sub-surface-level metal feature 105 has sidewalls adjacent to the surface-level dielectric layer 110 in which the metallized via 231, metallized trace 232, and top pad 233 are embedded.

As further shown in FIG. 4A, the process 400 may repeat operations 201, 209, 211, 214, 224, 227 to embed metal features in a plurality of levels and enable multiple routing layers, for example with both micro-strip and stripline routing. With multiple layers of embedded metallized traces 232, much higher I/O density is possible than where routing is only possible for a surface-level metal layer. After performing the desired number of iterations, the process 400 completes with the finish metal plating operation 420.

At operation 420 a dry film resist (DFR) is laminated and patterned using any technique known in the art. In the exemplary embodiment illustrated in FIG. 4B the DFR 421 is patterned to expose the fill metal 225 in the embedded metallized via 231 (and/or embedded metallized top pad 233) without exposing the embedded metallized trace 232. To account for alignment variation, openings in the DFR 421 may have smaller lateral dimensions to form a surface finish with lateral dimension $W_{SF}$ that smaller than the embedded metal filled features (e.g., $W_{TP}$).

At operation 445, a surface finish metal is plated over the exposed via fill metal to a thickness less than that of the DFR. The surface finish metal may be any of those described elsewhere herein, and for example may include a stack of Ni, Pd, and Au or Ni and Au metal layers. As shown in FIG. 4B, the finish metal 425 plates on regions of the remaining seed layer 215 which are not protected by the DFR 421. Because the embedded metallized trace 232 is protected by the DFR 421, no surface finish metal is formed. Minimum spaces between adjacent metallized traces 232 are therefore rendered independent to the metal finish thickness.

Optionally, additional fill metal (e.g., copper) may also be plated at operation 445 prior to plating of the surface finish metal. For an embedded metallized via 231 with a diameter of approximately 50-55 μm, a larger top pad opening (e.g., 75 μm) may be opened and an additional fill metal and/or surface finish then plated to a thickness less than that of the DFR 421 over the seed layer 215 present beyond the embedded metallized via 231. For such an embodiment, the fill metal forms a topographical feature (i.e., a top pad) protruding from the top surface of the surface-level dielectric layer 110 with sidewalls which are free of the surface finish metal 245. As such, a top pad may be embedded in the surface-level dielectric layer 110 (e.g., as illustrated in FIG. 4B by embedded top pad 233) or disposed above a top surface of the surface-level dielectric layer 110.

At operation 422, the DFR is removed using any conventional strip process and the thin seed layer 215 is selectively etched to expose the surface-level dielectric layer 110 between the embedded metallized via 231, the embedded metallized trace 232, and the top pad 233.

Figure 5:
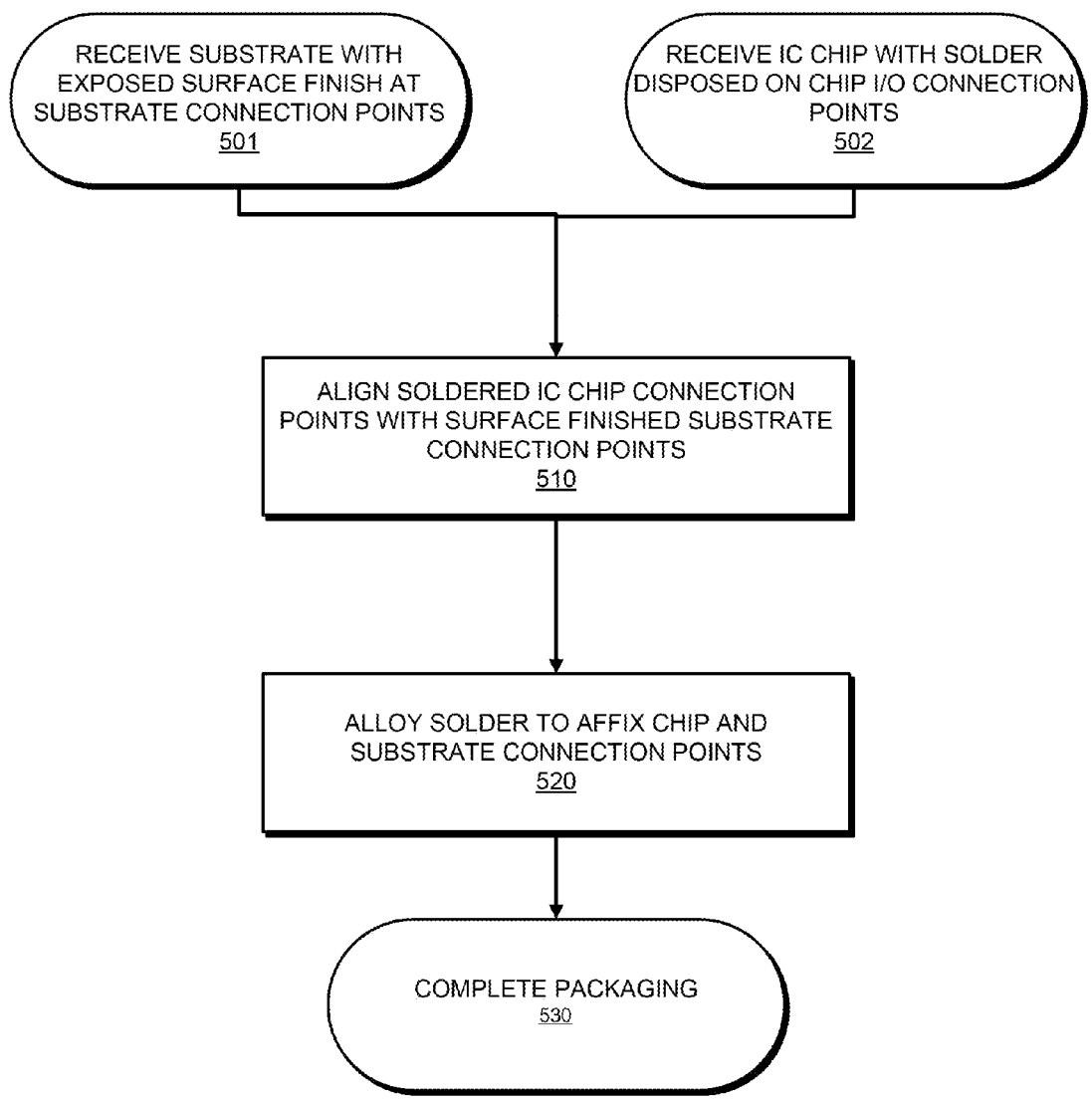
FIG. 5 is a flow diagram of an assembly process utilizing a substrate with reduced bump pitch in accordance with an embodiment of the present invention.

FIG. 5 is a flow diagram of an assembly process 500 utilizing a package substrate with reduced bump pitch in accordance with an embodiment of the present invention.

Figure 6:
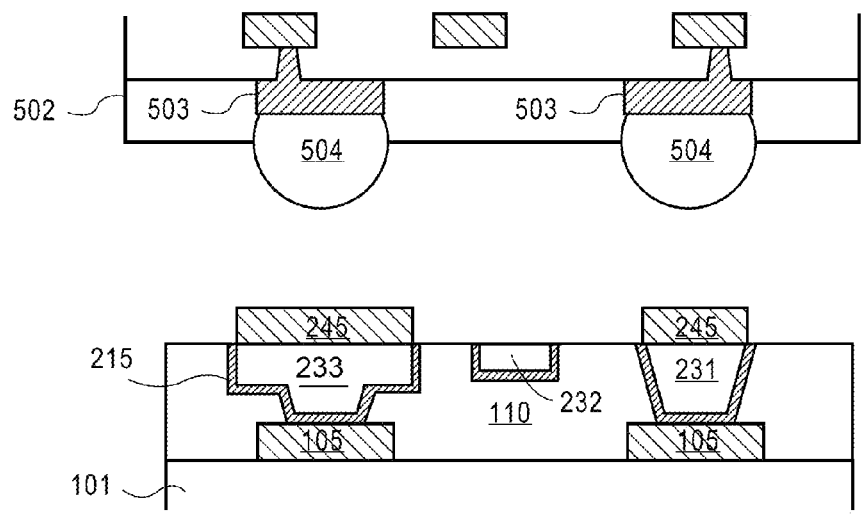
FIGS. 6-7 are cross-sectional views of selected operations illustrating stages in the package assembly process described in FIG. 5 for a substrate with reduced bump pitch, in accordance with an embodiment of the present invention.
Figure 7:
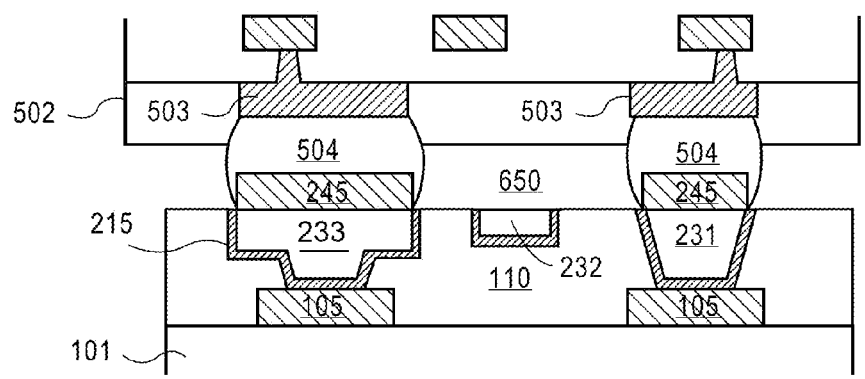

Assembly process 500 begins at operation 501 with receiving a package substrate with exposed surface finish at predetermined substrate connection points. As such, in the exemplary embodiments, no solder resist is present on the surface of the package substrate and no solder is placed on the surface finish prior to coupling a chip to the package substrate. Any of the package substrates fabricated in the processes 200, 300 or 400 may be used in the assembly process 500. FIGS. 6-7 are cross-sectional views of selected operations illustrating stages in the package assembly process 500, in accordance with another exemplary embodiment. As depicted in FIGS. 6-7, the substrate connections points may be either a surface finished pad 233 or embedded metallized via 231.

At operation 502, an IC chip is received with solder bumps disposed on the chip connection points. While the IC chip may generally be of any conventional type, in a particular embodiment, the IC chip is a microprocessor having a large I/O count. In an embodiment, the chip I/O and power solder bumps may have a pitch of less than 100 μm (e.g., 90 μm). As shown in FIG. 6, the IC chip 502 includes solder bump 504 on a surface level chip-side metal feature 503. The IC chip 502 then aligned with the surface finished substrate to have the soldered IC chip connection points aligned with the surface finished substrate connection points. The chip side solder is then alloyed at operation 520 to affix the chip to the substrate connection points. As shown in FIG. 7, the package substrate has exposed surface finish metal 245 at substrate connection points forming a topographical feature protruding beyond a top surface of the surface-level dielectric layer 110 disposed between adjacent connection points. In particular embodiments, as described elsewhere herein, the surface finish metal 245 has a thickness that is equal to at least half a smallest lateral space between the adjacent metal traces 232.

As shown in FIG. 7, the chip solder bump 504, when alloyed may wrap around the surface finish protruding from the surface-level dielectric layer 110 to contact a sidewall of the surface finish metal 245. As illustrated in FIG. 7, the chip solder bump 504 may be coupled directly to surface finish of the embedded metallized via 231 (i.e., with no top pad of larger dimension than the embedded metallized via 231), or alternatively, the chip solder bump 504 may be coupled directly to surface finish of the embedded metallized 233.

With the chip affixed to the package substrate conventional underfill 650 may be applied to fill the gap between the IC chip 502 and package substrate 101. As no solder resist is applied to the package substrate, the underfill 650 contacts the top surface of the surface-level dielectric layer 110. For the embodiment illustrated in FIG. 7B, the underfill 650 also contacts the embedded metal trace 232 where surface finish is not applied. The packaging process is then completed using conventional techniques.

The above description of illustrative embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The scope of the invention is to be determined entirely by the following claims, which are to be construed in accordance with established doctrines of claim interpretation.

What is claimed is:

1. A method for assembly of an IC chip to a package substrate, the method comprising:

providing an IC chip having an plurality of IC chip connection points each of said IC chip connection points having solder disposed thereon;

providing a package substrate having a plurality of package substrate connection points, each of said package connection points having a surface-level metal feature comprising a fill metal embedded in a surface level dielectric, said surface-level dielectric disposed between adjacent package substrate connection points, each of said package substrate connection points having a surface finish metal formed on said fill metal and protruding beyond the top surface of said surface-level dielectric, said package substrate further comprising a metal trace embedded within said surface-level dielectric between two of said package substrate connection points;

aligning the IC chip connection points with the package substrate connection points; and alloying the solder on the IC chip connection points with the surface finish metal on the package substrate connection points to affix the IC chip connection points to the package substrate connection points.

2. The method of claim 1, further comprising: underfilling a gap between the IC chip and package substrate to contact the top surface of the surface-level dielectric layer with the underfill.

3. The method of claim 1, wherein the fill metal has a different composition than the surface finish metal and the surface finish metal has a thickness that is equal to at least half a smallest lateral space between adjacent metal features embedded in the surface-level dielectric.

4. The method of claim 1 wherein said embedded metal trace has an exposed top surface substantially coplanar with the top surface of said surface-level dielectric.

5. The method of claim 1 further comprising a surface metal finish formed on said metal trace and protruding beyond the top surface of said surface-level dielectric.

* * * * *